(12) United States Patent
Groetsch et al.

(10) Patent No.: US 8,664,847 B2
(45) Date of Patent: Mar. 4, 2014

(54) ARRANGEMENT AND METHOD FOR GENERATING MIXED LIGHT

(75) Inventors: Stefan Groetsch, Lengfeld-Bad Abbach (DE); Georg Bogner, Lappersdorf (DE); Berthold Hahn, Hemau (DE); Volker Haerle, Laaber (DE); Kirstin Petersen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 302 days.

(21) Appl. No.: 12/524,890

(22) PCT Filed: Jan. 30, 2008

(86) PCT No.: PCT/DE2008/000167
§ 371 (c)(1),
(2), (4) Date: Nov. 13, 2009

(87) PCT Pub. No.: WO2008/092437
PCT Pub. Date: Aug. 7, 2008

(65) Prior Publication Data
US 2010/0084964 A1  Apr. 8, 2010

(30) Foreign Application Priority Data

Feb. 2, 2007 (DE) .......... 10 2007 005 343
Mar. 2, 2007 (DE) .......... 10 2007 010 244

(51) Int. Cl.
*H05B 33/02* (2006.01)
(52) U.S. Cl.
USPC .......................................... 313/502
(58) Field of Classification Search
USPC .......................................... 313/502
See application file for complete search history.

(56) References Cited

U.S. PATENT DOCUMENTS

| 6,066,861 | A | 5/2000 | Höhn et al. |
| 6,273,589 | B1 * | 8/2001 | Weber et al. .................. 362/293 |
| 2002/0015013 | A1 | 2/2002 | Ragle |
| 2002/0130326 | A1 | 9/2002 | Tamura et al. |
| 2002/0180351 | A1 * | 12/2002 | McNulty et al. .............. 313/512 |
| 2003/0205714 | A1 * | 11/2003 | Sugawara et al. .............. 257/89 |
| 2004/0159779 | A1 * | 8/2004 | Duff ............................. 250/221 |
| 2004/0217364 | A1 | 11/2004 | Tarsa et al. |
| 2005/0117334 | A1 | 6/2005 | Lee et al. |
| 2005/0205845 | A1 | 9/2005 | Delsing et al. |
| 2006/0244712 | A1 | 11/2006 | Cho et al. |
| 2007/0018182 | A1 | 1/2007 | Beeson et al. |
| 2007/0069643 | A1 | 3/2007 | Brunner et al. |
| 2007/0247414 | A1 * | 10/2007 | Roberts ......................... 345/102 |
| 2008/0130265 | A1 * | 6/2008 | Negley et al. .................. 362/84 |

FOREIGN PATENT DOCUMENTS

| CN | 1596478 A | 3/2005 |
| DE | 196 38 667 A1 | 4/1998 |
| DE | 198 45 229 C1 | 3/2000 |
| DE | 10 2004 023 110 A1 | 6/2005 |
| DE | 10 2005 020 695 A1 | 12/2005 |

(Continued)

*Primary Examiner* — Anh Mai
*Assistant Examiner* — Hana Featherly
(74) *Attorney, Agent, or Firm* — Slater & Matsil, L.L.P.

(57) ABSTRACT

At least two semiconductor components emit electromagnetic radiation in different wavelength ranges. The superimposition of these electromagnetic radiations of all semiconductor components has at least one fraction in the visible wavelength range. At least one of the semiconductor components has a luminescence conversion element in the beam path.

13 Claims, 7 Drawing Sheets

(56) References Cited

FOREIGN PATENT DOCUMENTS

| DE | 10 2004 052 456 A1 | 4/2006 |
| EP | 1 394 867 A2 | 3/2004 |
| WO | WO 2004/030109 A1 | 4/2004 |
| WO | WO 2004/068597 A2 | 8/2004 |
| WO | WO 2004/097949 A1 | 11/2004 |
| WO | WO 2005/030903 A1 | 4/2005 |
| WO | WO 2006/033031 A2 | 3/2006 |
| WO | WO 2006/035388 A2 | 4/2006 |
| WO | WO 2006/064996 A1 | 6/2006 |

* cited by examiner

ARRANGEMENT AND METHOD FOR GENERATING MIXED LIGHT

This patent application is a 371 filing of PCT/DE2008/000167, filed Jan. 30, 2008, which claims the priority of German patent applications 10 2007 005 343.8, filed Feb. 2, 2007, and 10 2007 010 244.7, filed Mar. 2, 2007, each of which is hereby incorporated by reference in its entirety.

TECHNICAL FIELD

The invention relates to an arrangement and a method for generating a mixed light with several semiconductor components.

BACKGROUND

In image reproduction or projection technology, mixed light sources, i.e., sources such as white light sources for electromagnetic radiation of different wavelengths are used as light sources for backlighting, among other things. One can mention, for the sake of example, LCD projection or image reproduction as a field of application. Mixed light serves there for brightening the liquid crystal matrix situated in the image reproduction system or projection system. This matrix has a plurality of individual liquid crystals. Depending on the applied control voltage and the wavelength of the light passing through the crystal, the crystals become transparent. This liquid crystal matrix is generally referred to as a light modulator. By illuminating the light modulator with a mixed light, the image generated by the driving becomes visible and achieves a perceptible contrast.

The use of digital light processing (DLP) technology is also conceivable as a light modulator. In this case, microscopic mirrors (digital micromirror devices, DMD) that are mounted on a chip are used. These mirrors are movable and have two stable end states, between which it is possible to change within a few microseconds under the force exerted by electromagnetic fields. Light is directed by the inclination of the individual micromirrors either directly to the optical system, or to an absorber. Different degrees of brightness of the individual image pixels can be generated by pulse-width modulated driving of the mirrors. Unlike in LCD technology, the mirrors in this case operate wavelength-independently. The so-called primary colors red, green and blue are sequentially switched onto the CMD chip to generate color images. The position of the mirrors determines the color component in the image. Because of the more direct light path as compared to LCD technology, and the lack of polarization of the light, higher output light powers are generated than with an LCD projector.

To date, semiconductor-generated mixed light has been generated by the combination of so-called primary colors. These primary colors are electromagnetic radiation with the colors red, green and blue generated by an emitting semiconductor element, e.g., an LED. So-called mixed light originates from the superimposition of these three colors. It has a multiplicity of different wavelengths in the visible range, for example, in the range from 380 nm to 780 nm.

To generate these different wavelengths, the active layers of the PN-junction in the semiconductor component are doped differently, for example. The resulting energy level difference, in the energy level diagrams, also referred to as bandgaps, lead to emission of light of different wavelengths. The wavelength of this light is directly dependent on the energy level difference, and is adjustable to an extent by means of the doping.

The color green has a significant role in the thus-generated mixed light, since the human eye is most sensitive in its absorption properties to the color green. It is accordingly especially necessary in image reproduction systems to generate the color green as authentically and stably as possible.

The semiconductor components, especially for use in projection systems, are operated at a high current density. Thereby a high radiation flux density, or a high beam intensity, is achieved. This high current density causes an effect known in technology as wavelength drift in conventionally manufactured LEDs.

The primary wavelength that is emitted changes because of the higher current density. Conventionally manufactured green-emitting InGaN-LEDs, in particular, have a high dependency of the emitted wavelength on the operating current. When this current is elevated, the operating wavelength, which preferably lies between 520 nm and 560 nm, shifts to a shorter wavelength, which is referred to as "drift." Thus, for example, a green-emitting InGaN-semiconductor component will illuminate with a bluish cast when operated at high current density.

This effect has two substantial disadvantages. First, the desired wavelength changes for a mixed light source operated at a high current density. For the white light source mentioned as an example, the wavelength drift will produce a bluish-appearing light source. Because of the high sensitivity of the human eye to the color green, a subjective color impression arises. The already mentioned driving of a light modulator in projection systems is modified in the sense that the spectral distance between green-emitting and blue-emitting semiconductor components is reduced and the separation of the two colors, even with the aid of wavelength-selective dielectric edge or bandpass filters or mirrors in the light modulator, is made more difficult and cost-intensive.

An additional crucial disadvantage in case of wavelength drift is a clearly worsened energy efficiency and an associated deteriorated effectiveness.

SUMMARY

In one aspect, the invention provides for the generation of a mixed light that has a very stable and constant wavelength spectrum even at high current density.

To generate a mixed light, an arrangement and a method with several electromagnetic radiation-emitting semiconductor components are specified according to the invention. At least one semiconductor component is provided that has a luminescence conversion element in the beam path. The mixed light source obtained by stabilizing the beam intensity and the wavelength, which now has a substantially higher energy efficiency and a much more constant mixed wavelength, is advantageous in this regard.

Additional advantageous configurations of the invention are specified herein.

To generate a mixed light with defined wavelengths, an arrangement and a method are described that are realized with the aid of semiconductor components, wherein at least one semiconductor component has a luminescence conversion element, and this semiconductor component emits a primary wavelength situated in the short-wavelength visible or the short-wavelength invisible wavelength range. It is advantageous that it is possible to create very stable emitting semiconductor components for the near-ultraviolet or lower visible wavelength range, which additionally exhibits a large independence with respect to the operating current density, and a high energy efficiency.

It is further provided that the luminescence conversion element produces a secondary wavelength in the visible range. The crucial and advantageous effect here is obtaining a mixed light visible to the human eye and with a stable wavelength. The stabilization of the wavelength for green light, even under a high current intensity load, creates a stable color impression for people.

The conversion of a semiconductor component to green light emission is possible, for instance, by using an oxynitride-based or silicate-based luminescence conversion element. The use of an ultraviolet-emitting semiconductor component as the primary radiator is possible. A green-emitting semiconductor component now becomes possible, for example, by converting this semiconductor component emitting in the invisible wavelength range.

White light is mentioned as an example for the use of a mixed light. Since the illumination devices in image reproduction or projection systems serve to brighten and provide contrast to the image to be represented, the arrangement described according to this claim is advantageous over and against a conventional arrangement. Even under a high current density load, semiconductor components thus arranged and described generate a very constant white light with respect to wavelength stability, and undesired wavelength drifts are absent. A subjective color impression, in particular, the shift of the white light into a seemingly bluish bright light, is prevented.

By using an oxynitride-based or silicate-based luminescence conversion element or other green-luminescing materials that can be stimulated by UV-radiation, it is possible to convert a semiconductor component towards green light, for example. The color impressions produced by the properties of the human eye can be kept stable with the aid of this conversion means.

In another implementation, the luminescence conversion element is inserted into the beam path of the semiconductor component. A potted volume serves as a use. This arrangement represents a very economical and effective fabrication variant. An increase of the cost savings and a minimization of the fabrication expense can be achieved by coating or covering the potted volume with the conversion material.

Due to minimal absorption and maximal reflection of the emitted primary wavelength of the semiconductor chip at the semiconductor material itself, the beam intensity provided for the conversion is intensified and is further optimized with respect to the energy yield. A semiconductor chip that is maximally reflective for the obtained secondary wavelength is likewise advantageous for obtaining a further increase of energy efficiency. For this purpose a reflecting element in the form of a mirror layer is placed over the potted volume.

BRIEF DESCRIPTION OF THE DRAWINGS

The invention will be described below on the basis of exemplary embodiments with reference to the drawing, in the figures of which identical or identically functioning components are labeled with respectively identical reference numbers. The illustrated elements are not to be considered true to scale; rather, individual elements may be shown exaggeratedly large or exaggeratedly simplified for the sake of better comprehension. Therein.

DETAILED DESCRIPTION OF ILLUSTRATIVE EMBODIMENTS

Figure 1:
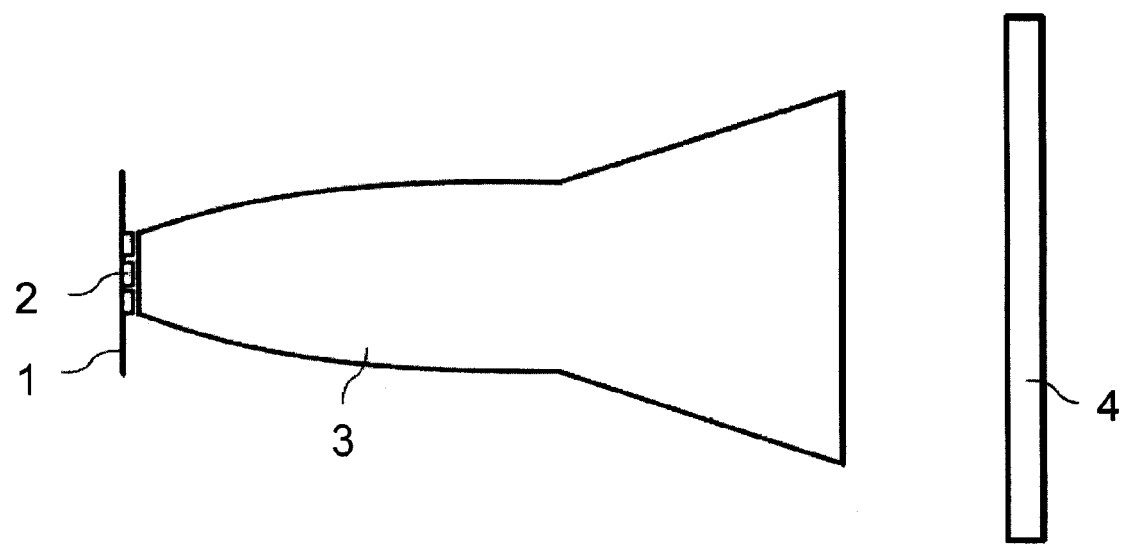
FIG. 1 shows a schematic representation of a projection system.

FIG. 1 shows a schematic representation of projection system such as is used in projection equipment, for example, in digital projectors or in rear projection equipment, also called rear projection television (RPTV).

An illumination device 1 is specified that generates a mixed light with different wavelengths. Since the generated light serves for illumination, at least a portion lies in the visible range. It is not necessary, however, that all the light in the mixed light lie in the visible range. Illumination device 1 has three mixed light radiators 2, each emitting a mixed light. The generated mixed light is deflected via an optical element 3 onto a light modulator 4. Light modulator 4 is, for example, a liquid crystal matrix, also referred to as an LC-matrix. A predetermined surface area of light modulator 4 is uniformly illuminated by optical element 3 with the light emitted from illumination device 1.

As mentioned above, a DMD-chip is equally conceivable as a light modulator 4. Then, however, illumination device 1 does not generate a mixed light, but instead the primary colors are emitted separately from one another. The wavelength-dependent sequential driving of the DMD-chip necessary to obtain a color image is thereby made possible.

Figure 2:
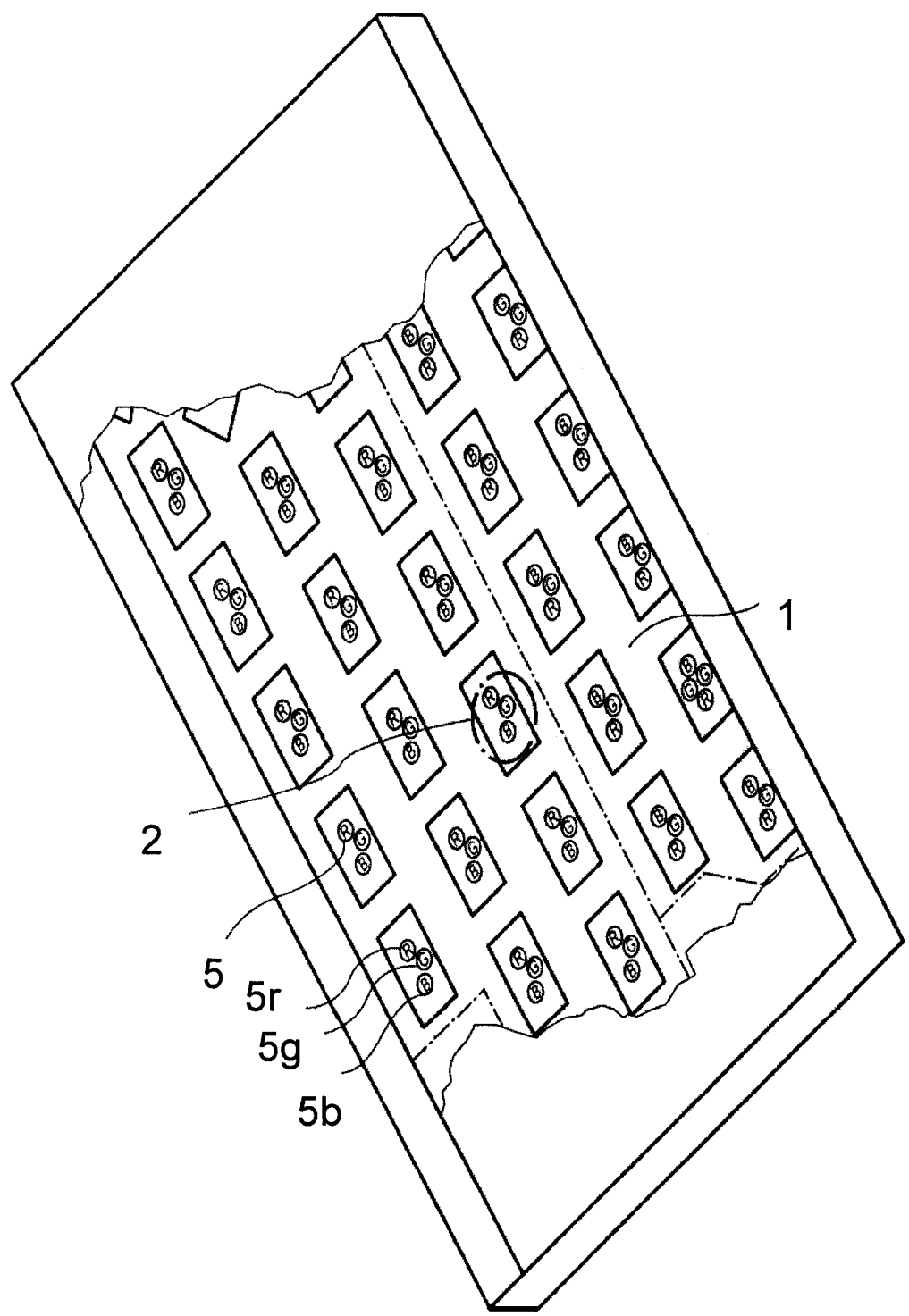
FIG. 2, shows an illumination device of an image reproduction system.

The illumination device 1 of an LCD backlight is represented in FIG. 2. A markedly higher number of individual mixed light radiators 2 are shown here. A two-dimensional arrangement is provided in which the mixed light radiators 2 are arranged in several rows. The rows with the mixed light radiators 2 are offset by half an interval in order to assure a uniform illumination of optical element 3. Other arrangement variants are also conceivable. Each of the mixed light radiators 2 here is composed of three individual light-emitting diodes 5. The mixed light is generated, for example, via the primary colors red, green and blue, with each light-emitting diode 5 principally emitting one primary color. Light-emitting diode 5r emits essentially the color red, red being the color of light that has a wavelength of 615-740 nm. In addition, light-emitting diode 5b emits essentially the color blue, blue being the color of light that has a wavelength of 430-500 nm. Finally, light-emitting diode 5g emits essentially the color green, green being the color of light that has a wavelength of 510-565 nm. The present embodiment is selected with the colors red, green and blue, adopting the conventional RGB-model. An illumination device 1 as illustrated in FIG. 2 is also referred to as a "backlight" and is present, for example, in liquid crystal displays or liquid crystal projectors. The mixed light need not necessarily be generated from three LEDs. Although the individual LEDs preferably emit red, green or blue, arrangements of up to six primary colors are conceivable. Optical element 3 serves here for homogeneous distribution of the emitted mixed light onto the predetermined surface area of light modulator 4.

In another embodiment, the light-emitting diodes 5 emitting the primary colors are arranged in a regular matrix and are used directly as a projection surface. This arrangement is referred to as an LED display wall. The light-emitting diodes 5 are referred to in this case as subpixels, with the combination of one red-emitting, one green-emitting and one blue-emitting light-emitting diode being defined as a pixel. The different primary radiators are driven by a drive signal in such a manner that the image to be projected or represented results.

Figure 3:
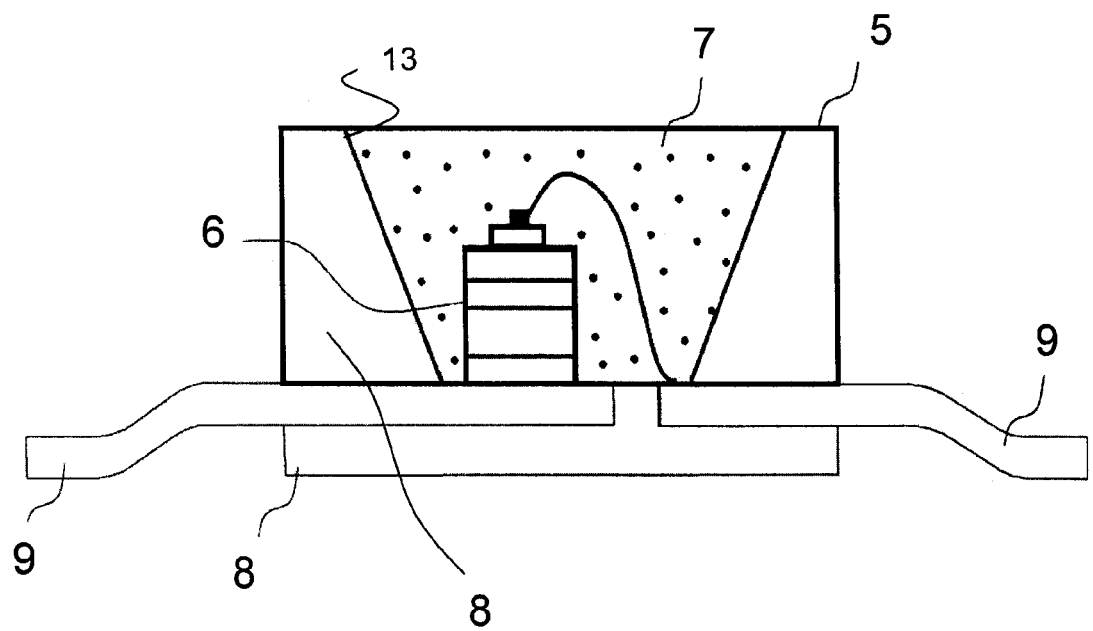
FIG. 3, shows an embodiment of a light-emitting diode for the generation and conversion of electromagnetic radiation.

A schematic structure of a light-emitting diode 5 is presented in FIG. 3. The light-emitting diode here has a component housing 8. An electric current is supplied via the electrical connection wires 9 that lead into the interior of the housing. A potted volume 13 that encloses a semiconductor chip 6 and a luminescence conversion element 7 is situated inside the component housing 8. Semiconductor chip 6 inside potted volume 13 is excited by the supplied current and emits electromagnetic radiation, primarily of a defined wavelength. Differently from a conventional light-emitting diode, luminescence conversion element 7 is inserted in this example into the beam path of the light-emitting semiconductor chip 6. The primary generated wavelength is converted into a secondary wavelength by conversion element 7. For the sake of example, an arrangement is mentioned here in which semiconductor chip 6 and the corresponding conversion material 7 are produced in a common potted volume 13. To improve the conversion of the primary wavelength, the material of semiconductor chip 6, for example, is designed such that the primary wavelength is maximally reflected and minimally absorbed. The same applies to the material of semiconductor chip 6 concerning the secondary wavelength. The material of potted volume 13 is chosen in such a manner, for instance, that the primary wavelength is minimally reflected and minimally absorbed. On the other hand, the material of luminescence conversion element 7 in the potted volume 13 is chosen in such a manner, for instance, that the primary wavelength is minimally reflected and maximally absorbed.

From the standpoint of wavelength stability and maximum possible light yield, converted light-emitting diodes particularly exhibit a markedly lower color shift at high current density in comparison to conventional light-emitting diodes. Efficiency losses in color superimposition when the different primary colors are additionally imaged by so-called dichroic filters onto light modulator 4 are also markedly lower.

Figure 4:
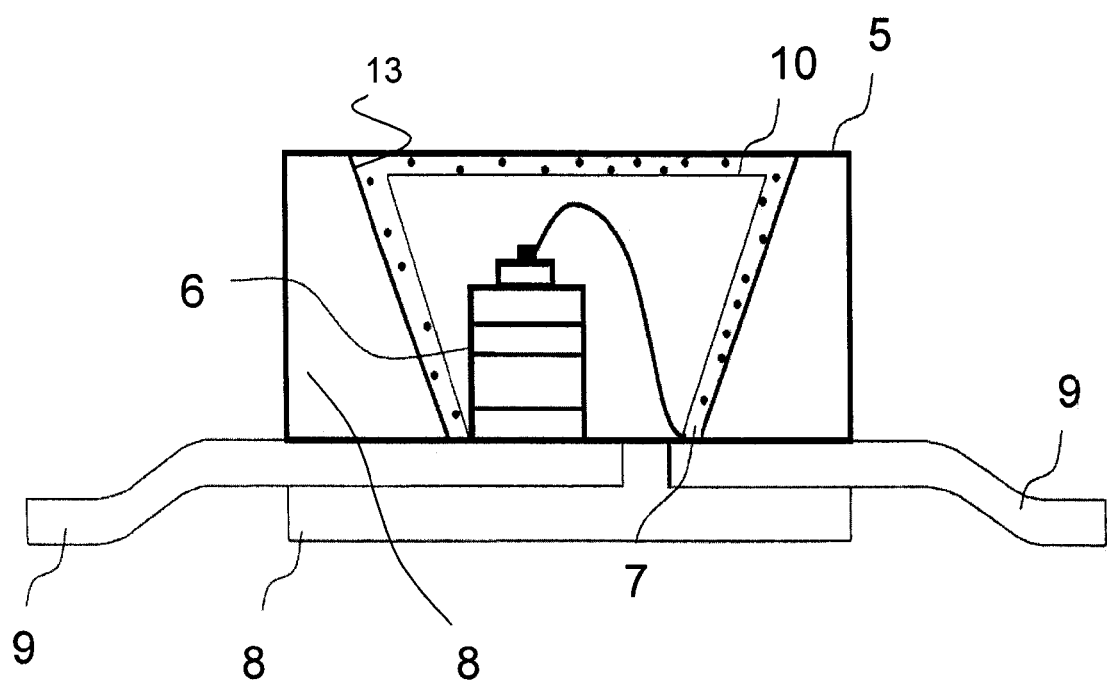
FIG. 4, shows an additional embodiment of a light-emitting diode for the generation and conversion of electromagnetic radiation.

An additional embodiment of a light-emitting diode 5 is specified in FIG. 4. The embodiment differs from FIG. 3 only in the coating 10 of potted volume 13 with the luminescence conversion element 7. Fabrication can thereby be performed less elaborately and more economically, or an increase of efficiency can be achieved. In FIG. 4, a coating between luminescence conversion element 7 and component housing 8 reflecting the primary emitted wavelength increases the energy efficiency.

Figure 5A:
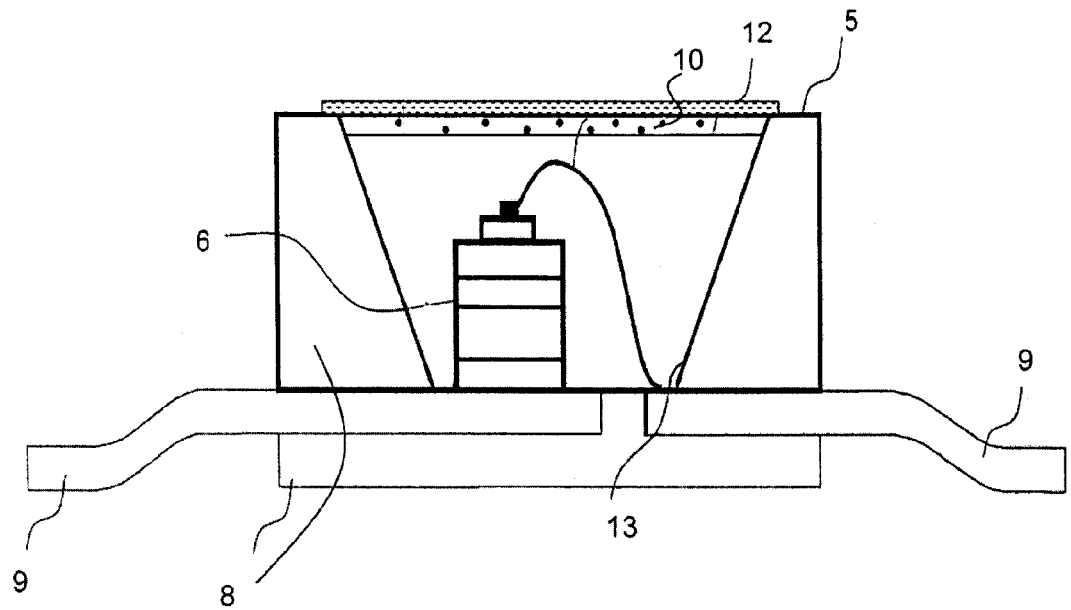
FIG. 5a, shows an additional embodiment of a light-emitting diode for the generation and conversion of electromagnetic radiation.

An additional embodiment of the invention is shown in FIG. 5*a*. Differing from FIG. 4, luminescence conversion element 7 is not inserted into the beam path of semiconductor chip 6 in the form of a coating of potted volume 13, but is placed instead at the upper edge of component housing 8 inside potted volume 13. This type of accommodation can be referred to as a covering with conversion element 10. Fabrication steps in the process can be enormously simplified by this type of accommodation.

Figure 5B:
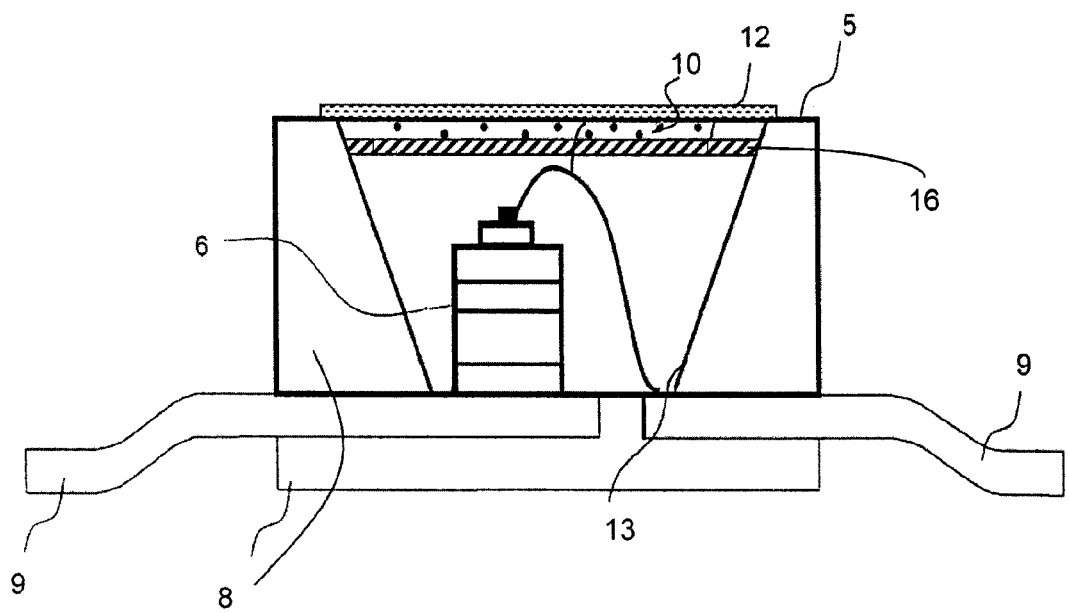
FIG. 5b, shows an additional embodiment of a light-emitting diode for the generation and conversion of electromagnetic radiation.

Another embodiment of the invention is shown in FIG. 5*b*. Unlike FIG. 5*a*, this embodiment additionally comprises a filter 16 that is arranged underneath conversion element 10, with the result that the radiation emitted from semiconductor chip 6 with the primary wavelength must first pass through filter 16 in order to reach luminescence conversion element 7. The material of filter 16 is selected, for example, such that filter 16 is transmissive for the radiation with the primary wavelength, while the converted secondary wavelength is reflected. If, for instance, filter 16 is arranged directly underneath the covering with conversion element 10, then the converted secondary wavelength can leave the covering with conversion element 11 only in the direction of reflecting element 12, whereby the efficiency is increased.

Figure 6:
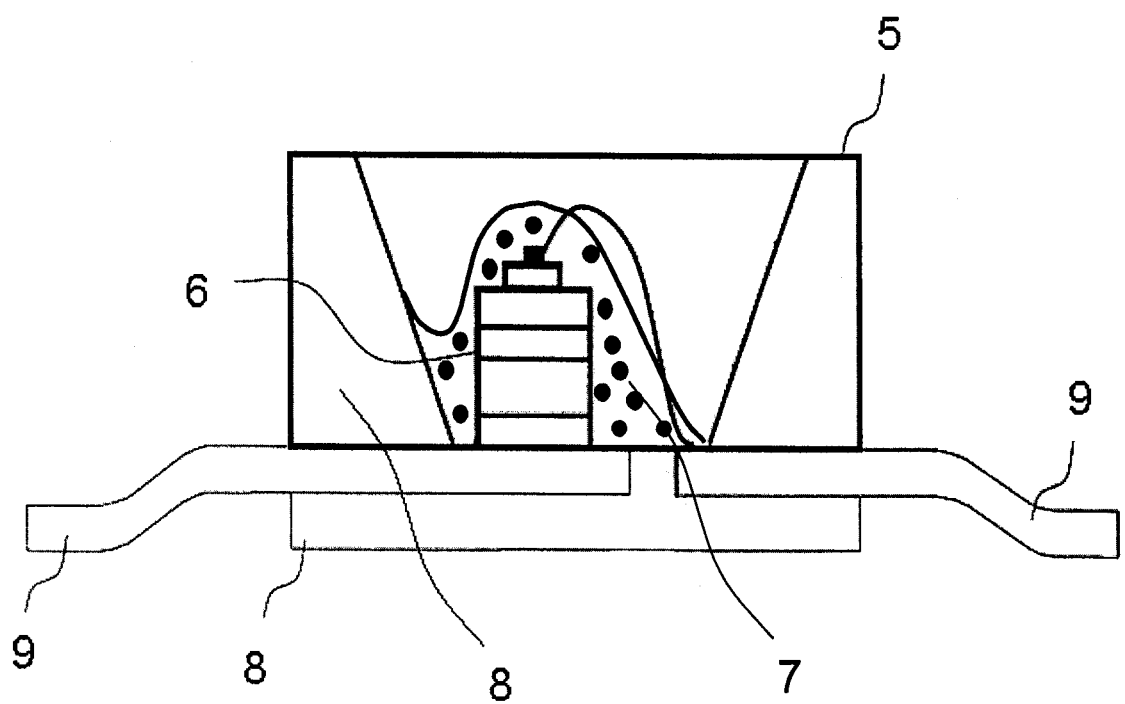
FIG. 6, shows an additional embodiment of a light-emitting diode for the generation and conversion of electromagnetic radiation.

In another embodiment of a light-emitting diode 5, illustrated in FIG. 6, luminescence element 7, unlike in previous embodiment examples, is placed directly in the vicinity of semiconductor chip 6. In an advantageous embodiment, semiconductor chip 6 is coated directly with luminescence conversion element 7. This type of construction is referred to as chip level conversion (CLC). In a variant that is not shown, the luminescence conversion element 7 is placed inside component housing 8 on an area above semiconductor chip 6. Point light sources for lens applications can thereby be created. In these embodiment variants, reflecting elements 12 in the form of a mirror are likewise provided in order to minimize light losses.

Figure 7A:
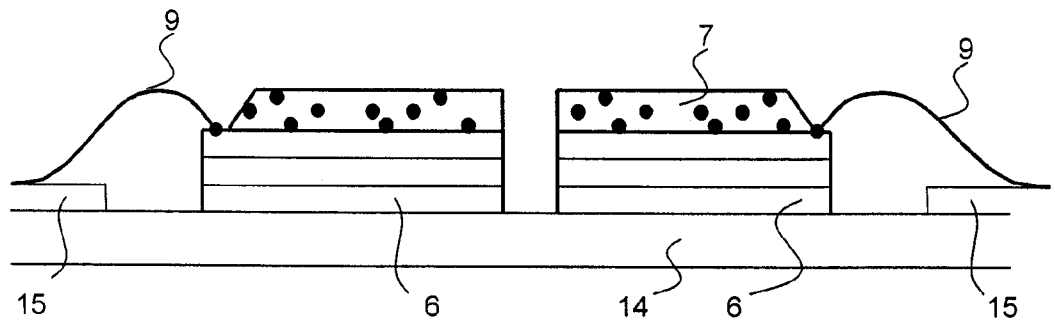
FIG. 7a, shows a schematic representation of a cross section of an LED light source for the generation and conversion of electromagnetic radiation.
Figure 7B:
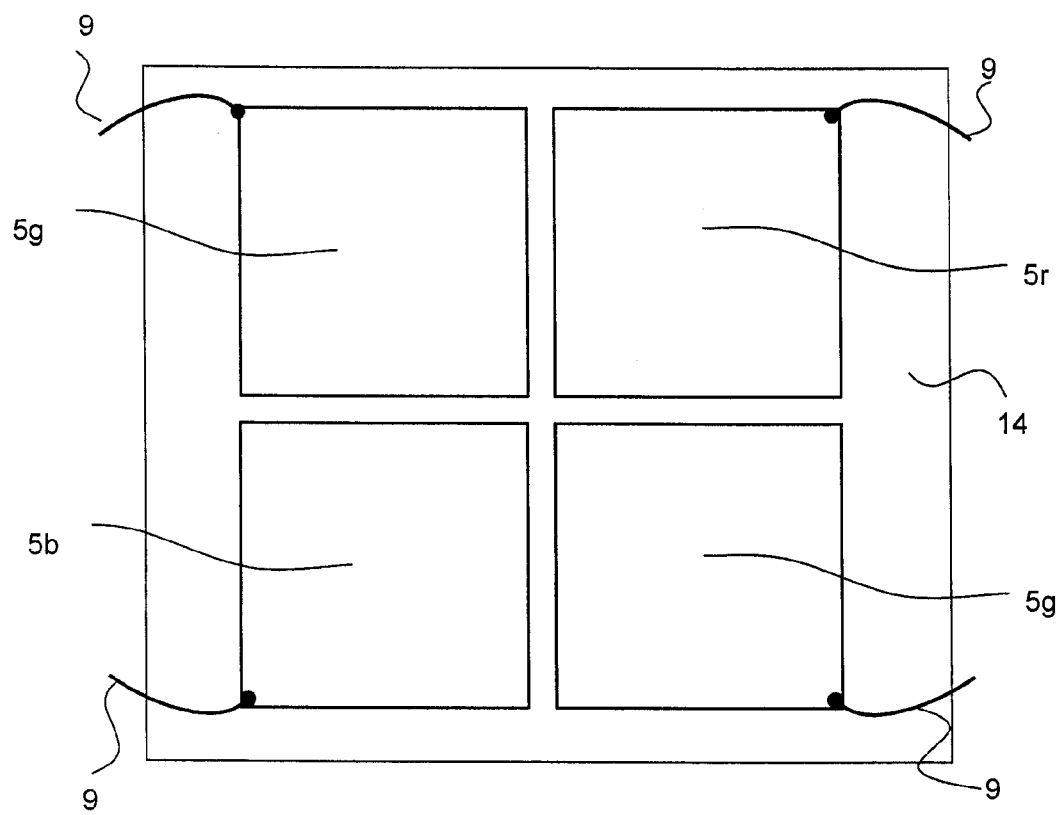
FIG. 7b, shows a schematic representation of a plan view of an LED light source for the generation and conversion of electromagnetic radiation.

FIGS. 7*a* and 7*b* each show an LED light source that is implemented in the form of a chip array. A cross section of such an array is shown in FIG. 7*a*. A common base surface serves as the lower part of the housing, and as a common heat sink for several semiconductor chips 6. These semiconductor chips are placed, for instance, in 2 rows with 2 semiconductor chips 6 on this heat sink 14. As implemented in FIG. 6, luminescence conversion element 7 is inserted into the beam path of semiconductor chip 6 by means of CLC technology. The electrical current necessary for operation is led to semiconductor chips 6 by means of electrical lead wires 9.

A plan view of this LED light source is shown in FIG. 7*b*. In this exemplary arrangement, an RGB variant is implemented with two green-emitting LEDs 5*g*, one red-emitting LED 5*r* and one blue-emitting LED 5*b*. Monochromatic light sources which emit only green light, for example, are also conceivable. To produce the color green, for example, light-emitting diode 5*g* is configured such that an oxynitride-based and silicate-based conversion material 7 is used. An ultraviolet light-emitting diode is used as the primary emitter. With a color saturation of 70-90%, ultraviolet primary emitters reach a higher beam intensity than the conventional green-emitting InGaN LEDs used until now. The arrangement on a common heat sink 14 has the advantage of a better heat dissipation and thus a more constant temperature, which acts positively against wavelength drift and efficiency loss.

The described arrangement and/or method relates to at least two semiconductor components emitting electromagnetic radiation, the electromagnetic radiation they are to emit lying in different wavelength ranges. The superimposition of these electromagnetic radiations of all semiconductor components has at least one fraction in the visible wavelength range. At least one of the semiconductor components has a luminescence conversion element in the beam path. This semiconductor component has a potted volume that unites both the semiconductor chip and the luminescence conversion element. The semiconductor chip is advantageously directly coated or covered with the luminescence conversion element. To maximize the energy efficiency, the semiconductor component has a reflective element.

The invention claimed is:

1. An arrangement for generating mixed light, the arrangement comprising:
   at least two semiconductor components emitting electromagnetic radiation in different wavelength ranges, each semiconductor component comprising a semiconductor chip and being used as a light source,
   wherein at least one of the semiconductor components has a luminescence conversion element in a beam path, the luminescence conversion element converting a primary wavelength, emitted from a semiconductor chip, into a secondary wavelength, and
   wherein the arrangement comprises a filter arranged in the beam path between the semiconductor chip and the luminescence conversion element, wherein the filter and the luminescence conversion element are arranged directly contacting one behind the other in the beam path, the filter being more transmissive for the primary wavelength than for the secondary wavelength and more reflective for the secondary wavelength than for the primary wavelength.

2. The arrangement according to claim 1, wherein the semiconductor component having a luminescence conversion element generates a short-wavelength primary wavelength in an invisible wavelength range.

3. The arrangement according to claim 2, wherein a generated converted secondary wavelength lies in a wavelength range of 430 nm to 760 nm.

4. The arrangement according to claim 1, wherein the semiconductor component having a luminescence conversion element generates a short-wavelength primary wavelength in a visible wavelength range.

5. The arrangement according to claim 1, wherein the arrangement comprises a white light source for an illumination device on image reproduction equipment.

6. The arrangement according to claim 1, wherein the luminescence conversion element contains silicates or oxynitrides, or green-converting phosphors that absorb in blue or ultraviolet ranges for conversion.

7. The arrangement according to claim 1, wherein the luminescence conversion element is produced in a potted volume with the semiconductor chip of one of the semiconductor components.

8. The arrangement according to claim 7, further comprising a reflective element inside a housing, the reflective element being inserted into the beam path of the semiconductor chip in such a manner that a primary wavelength is reflected, the reflective element being transparent to a secondary wavelength.

9. The arrangement according to claim 7, wherein the semiconductor chip minimally absorbs and maximally reflects a primary wavelength generated and reflected on the potted volume.

10. The arrangement according to claim 7, wherein the semiconductor chip minimally absorbs and maximally reflects a converted secondary wavelength.

11. The arrangement according to claim 7, wherein the potted volume around the semiconductor components is coated with the luminescence conversion element.

12. The arrangement according to claim 1, wherein the luminescence conversion element is placed directly on the semiconductor chip in the form of a coating.

13. The arrangement according to claim 1, wherein the luminescence conversion element comprises a covering of a component housing of the semiconductor component.

* * * * *

UNITED STATES PATENT AND TRADEMARK OFFICE
CERTIFICATE OF CORRECTION

PATENT NO. : 8,664,847 B2  
APPLICATION NO. : 12/524890  
DATED : March 4, 2014  
INVENTOR(S) : Groetsch et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 404 days.

Signed and Sealed this

Twenty-ninth Day of September, 2015

Michelle K. Lee
*Director of the United States Patent and Trademark Office*